US009501976B2

(12) United States Patent
Qian et al.

(10) Patent No.: US 9,501,976 B2
(45) Date of Patent: Nov. 22, 2016

(54) PIXEL CIRCUIT FOR ORGANIC LIGHT EMITTING DISPLAY AND DRIVING METHOD THEREOF, ORGANIC LIGHT EMITTING DISPLAY

(71) Applicant: Shanghai Tianma Micro-Electronics Co., Ltd., Shanghai (CN)

(72) Inventors: Dong Qian, Shanghai (CN); Tong Wu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/989,651

(22) Filed: Jan. 6, 2016

(65) Prior Publication Data

US 2016/0117990 A1 Apr. 28, 2016

Related U.S. Application Data

(63) Continuation-in-part of application No. 13/898,395, filed on May 20, 2013, now Pat. No. 9,269,304.

(30) Foreign Application Priority Data

Dec. 26, 2012 (CN) .......................... 2012 1 0577002

(51) Int. Cl.
G09G 3/3258 (2016.01)
G09G 3/32 (2016.01)
G09G 5/10 (2006.01)

(52) U.S. Cl.
CPC .......... *G09G 3/3258* (2013.01); *G09G 3/3233* (2013.01); *G09G 3/3266* (2013.01);
(Continued)

(58) Field of Classification Search
None
See application file for complete search history.

(56) References Cited

U.S. PATENT DOCUMENTS

2009/0167648 A1   7/2009  Jeon et al.
2010/0073266 A1   3/2010  Na et al.
(Continued)

FOREIGN PATENT DOCUMENTS

EP         1939846 A2    7/2008
KR    1020100102872    5/2012

OTHER PUBLICATIONS

Search Report as issued in corresponding European Application No. 13165100.2, dated Feb. 6, 2014.

*Primary Examiner* — Viet Pham
*Assistant Examiner* — Christopher Kohlman
(74) *Attorney, Agent, or Firm* — Alston & Bird LLP

(57) ABSTRACT

A pixel circuit for an organic light emitting display includes first, second, third, fourth, fifth, and sixth MOS transistors, a first capacitor, and an organic light emitting diode. The gate electrode of the first MOS transistor receives a first scanning signal. A first electrode of the first MOS transistor receives a data signal. The gate electrode of the third MOS transistor receives a third control signal. The gate electrode of the fourth MOS transistor receives the first scanning signal. The gate electrode of the fifth MOS transistor receives a first control signal. A first electrode of the fifth MOS transistor receives a reference voltage. The gate electrode of the sixth MOS transistor receives a second scanning signal. The first electrode of the sixth MOS transistor receives the reference voltage.

20 Claims, 9 Drawing Sheets

(52) U.S. Cl.
CPC .......... *G09G 5/10* (2013.01); *G09G 2300/043* (2013.01); *G09G 2300/0426* (2013.01); *G09G 2300/0439* (2013.01); *G09G 2300/08* (2013.01); *G09G 2300/0819* (2013.01); *G09G 2300/0861* (2013.01); *G09G 2320/0233* (2013.01); *G09G 2320/045* (2013.01)

(56) References Cited

U.S. PATENT DOCUMENTS

| | | | |
|---|---|---|---|
| 2011/0069059 A1* | 3/2011 | Lee | G05F 1/56 345/212 |
| 2012/0001893 A1* | 1/2012 | Jeong | G09G 3/3233 345/213 |
| 2012/0069059 A1* | 3/2012 | Lee | G09G 3/3225 345/690 |
| 2012/0098877 A1* | 4/2012 | Taro | G09G 3/3225 345/691 |
| 2013/0083087 A1* | 4/2013 | Byun | G09G 3/3233 345/690 |

\* cited by examiner

PIXEL CIRCUIT FOR ORGANIC LIGHT EMITTING DISPLAY AND DRIVING METHOD THEREOF, ORGANIC LIGHT EMITTING DISPLAY

CROSS-REFERENCES TO RELATED APPLICATIONS

This application a Continuation-in-Part of U.S. patent application Ser. No. 13/898,395, filed on May 20, 2013, which application claims priority to Chinese Patent Application No. 201210577002.8, entitled "PIXEL CIRCUIT FOR ORGANIC LIGHT EMITTING DISPLAY AND DRIVING METHOD THEREOF, ORGANIC LIGHT EMITTING DISPLAY" filed with State Intellectual Property Office of People's Republic of China on Dec. 26, 2012, the contents of which are incorporated herein by reference in their entirety.

FIELD OF THE INVENTION

The present invention relates to organic light emitting displays, and more particularly to a pixel circuit for an organic light emitting display, a driving method thereof, and the organic light emitting display.

BACKGROUND OF THE INVENTION

With the continuous development of multimedia devices, the organic light emitting diode (OLED) has been increasingly used in high performance displays. In order to be adapted to large display size, a shorter driving time for a single pixel is required for a traditional passive matrix OLED. Therefore, an increased transient current is needed, resulting in increased power consumption. At the same time, the use of large current may lead to a too large voltage drop in a pixel array, so that the operation voltage of the OLED is too high and the power efficiency is reduced. However, in the active matrix organic light emitting diode (AMOLED), the problems are well solved by progressively scanning input OLED current line by line.

In AMOLED devices, pixel circuits formed with polysilicon thin film transistors are usually used to provide current for the OLED device. Compared with amorphous silicon thin film transistors, polysilicon thin film transistors have higher mobility and more stable characteristics. Accordingly, they are more suitable for AMOLED displays. However, due to the limitation of the crystallization process, the polysilicon thin film transistors made on a large glass substrate usually have heterogeneity in electrical parameters such as threshold voltage and mobility, and the heterogeneity may lead to differences in the current and brightness of the OLED display device.

In addition, in the application of large size displays, due to the resistance of the power line for the backplane and the fact that drive current for all the pixel units is supplied by the same power line, the supply voltage in a region closer to the power supply is higher than that in regions farther from the power supply in the backplane. This phenomenon is called internal resistance (IR) Drop. Given the correlation of the current with the supply voltage, the IR Drop may also cause current differences in different regions, and accordingly the OLED display devices in different regions have different brightness.

In the related art, a variety of technical solutions are utilized to solve the problem of brightness differences in the OLED display devices. For example, South Korea patent application No. 1020100102872 disclosed a pixel compensation circuit. However, there are still many problems in the existing technical solutions, such as a large number of signal lines and complex peripheral drive circuits.

BRIEF SUMMARY OF THE INVENTION

One inventive aspect of the invention is a pixel circuit for an organic light emitting display. The pixel circuit includes an organic light emitting diode, a first MOS transistor, including a gate electrode, a first electrode, and a second electrode, and a second MOS transistor, including a gate electrode, a first electrode, and a second electrode. The first electrode of the second MOS transistor is coupled to a first power supply. The pixel circuit also includes a third MOS transistor, including a gate electrode, a first electrode, and a second electrode, where the first electrode of the third MOS transistor is coupled to the second electrode of the second MOS transistor, and the second electrode of the third MOS transistor is coupled to a second power supply via the organic light emitting diode. The pixel circuit also includes a fourth MOS transistor, including a gate electrode, a first electrode, and a second electrode, where the first electrode of the fourth MOS transistor is coupled to the gate electrode of the second MOS transistor, and the second electrode of the fourth MOS transistor is coupled to the second electrode of the second MOS transistor. The pixel circuit also includes a fifth MOS transistor, including a gate electrode, a first electrode, and a second electrode, a sixth MOS transistor, including a gate electrode, a first electrode, and a second electrode, where the second electrode of the sixth MOS transistor is coupled to the second electrode of the third MOS transistor. The pixel circuit also includes a first capacitor, including first and second terminals, where the first terminal of the first capacitor is coupled to the second electrode of the first MOS transistor and is coupled to the second electrode of the fifth MOS transistor, and the second terminal is coupled to the gate electrode of the second MOS transistor and is coupled to the first electrode of the fourth MOS transistor. The gate electrode of the first MOS transistor receives a first scanning signal, the first electrode of the first MOS transistor receives a data signal, the gate electrode of the third MOS transistor receives a third control signal, the gate electrode of the fourth MOS transistor receives the first scanning signal, the gate electrode of the fifth MOS transistor receives a first control signal, the first electrode of the fifth MOS transistor receives a reference voltage, the gate electrode of the sixth MOS transistor receives a second scanning signal, and the first electrode of the sixth MOS transistor receives the reference voltage.

Another inventive aspect of the invention is a driving method for a pixel circuit. The pixel circuit includes an organic light emitting diode, a first MOS transistor, including a gate electrode, a first electrode, and a second electrode, and a second MOS transistor, including a gate electrode, a first electrode, and a second electrode. The first electrode of the second MOS transistor is coupled to a first power supply. The pixel circuit also includes a third MOS transistor, including a gate electrode, a first electrode, and a second electrode, where the first electrode of the third MOS transistor is coupled to the second electrode of the second MOS transistor, and the second electrode of the third MOS transistor is coupled to a second power supply via the organic light emitting diode. The pixel circuit also includes a fourth MOS transistor, including a gate electrode, a first electrode, and a second electrode, where the first electrode of the fourth MOS transistor is coupled to the gate electrode of the second MOS transistor, and the second electrode of the fourth MOS transistor is coupled to the second electrode of the second MOS transistor. The pixel circuit also includes a fifth MOS transistor, including a gate electrode, a first electrode, and a second electrode, a sixth MOS transistor, including a gate electrode, a first electrode, and a second electrode, where the second electrode of the sixth MOS transistor is coupled to the second electrode of the third MOS transistor. The pixel circuit also includes a first capacitor, including first and second terminals, where the first terminal of the first capacitor is coupled to the second electrode of the first MOS transistor and is coupled to the second electrode of the fifth MOS transistor, and the second terminal is coupled to the gate electrode of the second MOS transistor and is coupled to the first electrode of the fourth MOS transistor. The gate electrode of the first MOS transistor receives a first scanning signal, the first electrode of the first MOS transistor receives a data signal, the gate electrode of the third MOS transistor receives a third control signal, the gate electrode of the fourth MOS transistor receives the first scanning signal, the gate electrode of the fifth MOS transistor receives a first control signal, the first electrode of the fifth MOS transistor receives a reference voltage, the gate electrode of the sixth MOS transistor receives a second scanning signal, and the first electrode of the sixth MOS transistor receives the reference voltage. The method includes during a light-emitting stage, setting the first control signal at a low level, setting the third control signal at a high level until a voltage difference between the first electrode and the gate electrode of the second MOS transistor M2 becomes a threshold voltage of the second MOS transistor adding a diference bewteen a voltage of the data signal and the reference voltage.

Another inventive aspect of the invention is an organic light emitting display including a scanning drive unit, a data drive unit, N scan lines, M data lines, and a plurality of pixel circuits. Each of the pixel circuits includes an organic light emitting diode, a first MOS transistor, including a gate electrode, a first electrode, and a second electrode, and a second MOS transistor, including a gate electrode, a first electrode, and a second electrode. The first electrode of the second MOS transistor is coupled to a first power supply. Each pixel circuit also includes a third MOS transistor, including a gate electrode, a first electrode, and a second electrode, where the first electrode of the third MOS transistor is coupled to the second electrode of the second MOS transistor, and the second electrode of the third MOS transistor is coupled to a second power supply via the organic light emitting diode. Each pixel circuit also includes a fourth MOS transistor, including a gate electrode, a first electrode, and a second electrode, where the first electrode of the fourth MOS transistor is coupled to the gate electrode of the second MOS transistor, and the second electrode of the fourth MOS transistor is coupled to the second electrode of the second MOS transistor. Each pixel circuit also includes a fifth MOS transistor, including a gate electrode, a first electrode, and a second electrode, a sixth MOS transistor, including a gate electrode, a first electrode, and a second electrode, where the second electrode of the sixth MOS transistor is coupled to the second electrode of the third MOS transistor. Each pixel circuit also includes a first capacitor, including first and second terminals, where the first terminal of the first capacitor is coupled to the second electrode of the first MOS transistor and is coupled to the second electrode of the fifth MOS transistor, and the second terminal is coupled to the gate electrode of the second MOS transistor and is coupled to the first electrode of the fourth MOS transistor. The gate electrode of the first MOS transistor receives a first scanning signal, the first electrode of the first MOS transistor receives a data signal, the gate electrode of the third MOS transistor receives a third control signal, the gate electrode of the fourth MOS transistor receives the first scanning signal, the gate electrode of the fifth MOS transistor receives a first control signal, the first electrode of the fifth MOS transistor receives a reference voltage, the gate electrode of the sixth MOS transistor receives a second scanning signal, and the first electrode of the sixth MOS transistor receives the reference voltage. The scanning drive unit is configured to provide scanning signals to respective scan lines, the data drive unit is configured to provide data signals to respective data lines, and the plurality of the pixel circuits are respectively arranged in pixel areas formed near intersections of the scan lines and the data lines.

DETAILED DESCRIPTION OF THE INVENTION

Particular embodiments of the invention are illustrated herein in conjunction with the drawings.

Various details are set forth herein as they relate to certain embodiments. However, the invention can also be implemented in other ways different from the ways described herein, and modifications can be made by those skilled in the art without departing from the invention. Therefore, the invention is not limited to particular embodiments disclosed hereinafter.

Figure 1:
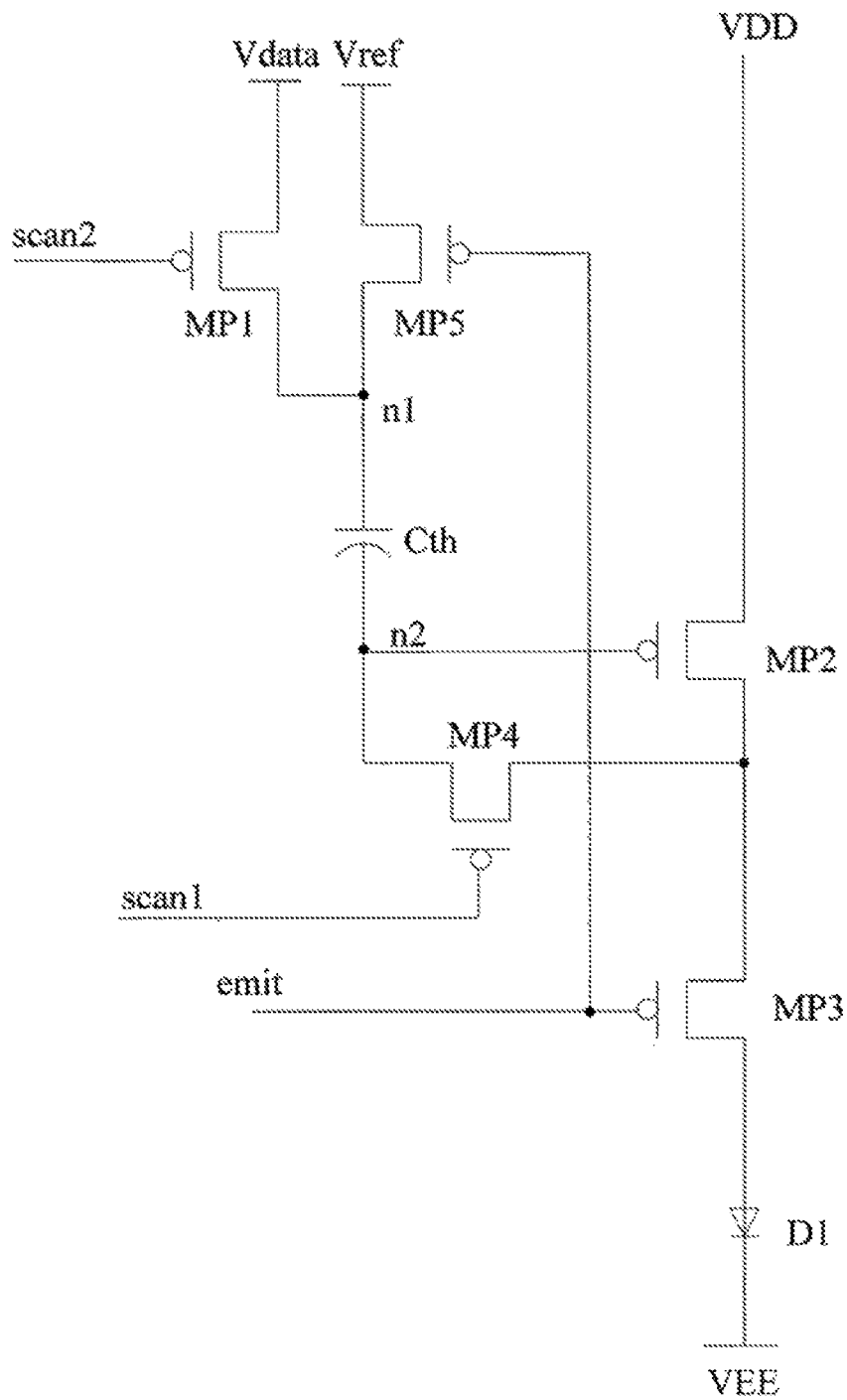
FIG. 1 is a schematic diagram of a pixel circuit according to an embodiment in the prior art.

As described above, AMOLED display devices have the problem of uneven brightness due to the influence of the threshold voltages of the polysilicon thin film transistors and the IR drop on the power line for the backplane. In order to solve these problems, a voltage driven pixel circuit including five polysilicon thin film transistors and one capacitor (5T1C) is usually used in the prior art. As shown in FIG. 1, the pixel circuit of the prior art includes a first positive channel Metal Oxide Semiconductor (PMOS) transistor MP1, a second PMOS transistor MP2, a third PMOS transistor MP3, a fourth PMOS transistor MP4, a fifth PMOS transistor MP5, a capacitor Cth and an organic light emitting diode D1.

The gate electrode of the first PMOS transistor MP1 receives a scanning signal scan2, the source electrode of the first PMOS transistor MP1 receives a data signal Vdata, and the drain electrode of the first PMOS transistor MP1 is connected to the first terminal n1 of the capacitor Cth. The second terminal n2 of the capacitor Cth is connected to the gate electrode of the second PMOS transistor MP2. The source electrode of the second PMOS transistor MP2 receives a first power supply VDD, and the drain electrode of the second PMOS transistor MP2 is connected to the source electrode of the third PMOS transistor MP3. The gate electrode of the third PMOS transistor MP3 receives a control signal "emit", and the drain electrode of the third PMOS transistor MP3 is connected to the anode of the organic light emitting diode D1. The cathode of the organic light emitting diode D1 is connected to a second power supply VEE. The gate electrode of the fourth PMOS transistor MP4 receives a scanning signal scan1, the source electrode of the fourth PMOS transistor MP4 is connected to the second terminal n2 of the capacitor Cth, and the drain electrode of the fourth PMOS transistor MP4 is connected to the drain electrode of the second PMOS transistor MP2. The gate electrode of the fifth PMOS transistor MP5 receives the control signal "emit", the source electrode of the fifth PMOS transistor MP5 receives a reference voltage Vref, and the drain electrode of the fifth PMOS transistor MP5 is connected to the first terminal n1 of the capacitor Cth.

Figure 2:
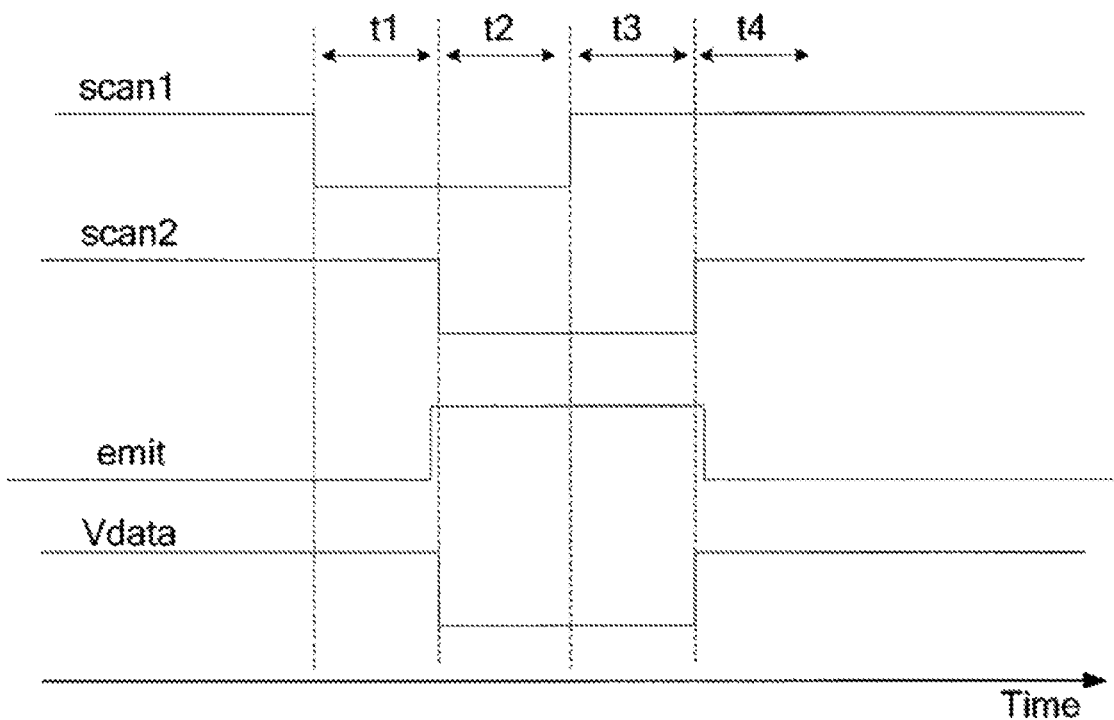
FIG. 2 is a timing diagram of driving signals for the pixel circuit shown in FIG. 1.

FIG. 2 shows a timing diagram of driving signals for the pixel circuit in FIG. 1. The operational principle of the pixel circuit shown in FIG. 1 is described in further detail in conjunction with the FIG. 2 as follows.

In Stage t1, both the scanning signal scan1 and the control signal "emit" are at a low level. Therefore, the second PMOS transistor MP2, the third PMOS transistor MP3, the fourth PMOS transistor MP4 and the fifth PMOS transistor MP5 are turned on. In this Stage, the second terminal n2 of the capacitor Cth is pulled down to a low potential, and the first terminal n1 of the capacitor Cth is applied with voltage Vref.

In Stage t2, the control signal "emit" is turned into high level, and the third PMOS transistor MP3 and the fifth PMOS transistor MP5 are turned off. In addition, the scanning signal scan1 is turned to a low level. Because the scanning signal scan1 and the scanning signal scan2 are in the low level, the first PMOS transistor MP1 and the fourth PMOS transistor MP4 are on. In this case, the first terminal n1 of the capacitor Cth is connected to the data signal Vdata, and a voltage (VDD–Vth) based on the threshold voltage Vth of the second PMOS transistor MP2 is developed at the second terminal n2 of the capacitor Cth. The voltage difference across the capacitor Cth is Vdata–(VDD–Vth).

In Stage t3, the scanning signal scan1 is turned to high level, and the fourth PMOS transistor MP4 is turned off.

In Stage t4, the control signal "emit" is turned to low level. Accordingly, the third PMOS transistor MP3 and the fifth PMOS transistor MP5 are turned on. In this case, the voltage at the first terminal n1 of the capacitor Cth becomes Vref. According to the law of charge conservation, the voltage at the second terminal n2 of the capacitor Cth becomes Vref–Vdata+(VDD–Vth), and the second PMOS transistor MP2 is turned on or off according to the voltage at the second terminal n2.

The voltage difference between the source electrode and the gate electrode of the second PMOS transistor MP2 is Vsg=VDD–Vref+Vdata–(VDD–Vth)=Vdata–Vref+Vth. It can be concluded that the current flowing through the second PMOS transistor MP2 is Im2=k(Vdata–Vref)^2, where k is a constant coefficient which is related to the mobility, the width to length ratio and the gate-source capacitance value of the MOS transistor. Thus the compensation for the threshold voltage Vth and the first supply voltage VDD is achieved.

However, in the pixel circuit described above, there is an overlap between the scanning signal scan1 and the scanning signal scan2 in time sequence. Specifically, referring to FIG. 2, both the scanning signal scan1 and the scanning signal scan2 are in low level in Stage t2. The structure and operation of the peripheral drive circuit for the pixel circuit with such structure is, therefore, complicated.

In addition, in the pixel circuit described above, it is necessary to continuously provide the data signal Vdata with a high potential to the drain electrode of the first PMOS transistor MP1. The data line connected to the first PMOS transistor MP1 can not be left floating, otherwise the compensation for the threshold voltage Vth and the first supply voltage VDD can not be achieved. This is because the drain electrode of the first PMOS transistor MP1 is connected to the drain electrode of the fifth PMOS transistor MP5. In Stage t1, when the fifth PMOS transistor MP5 is turned on, the voltage at the drain electrode of the fifth PMOS transistor MP5 is Vref. If the data line is left floating, a leakage current may occur in the drain electrode of the first PMOS transistor MP1, leading to an unstable voltage at the first terminal n1 of the capacitor Cth. Hence, the voltage difference across the capacitor Cth may change, and thus the compensation for the threshold voltage and the first supply voltage can not be actually achieved. Moreover, the need to continuously provide the data signal with high potential increases both the difficulty in IC development and the power consumption of the circuit.

Figure 3:
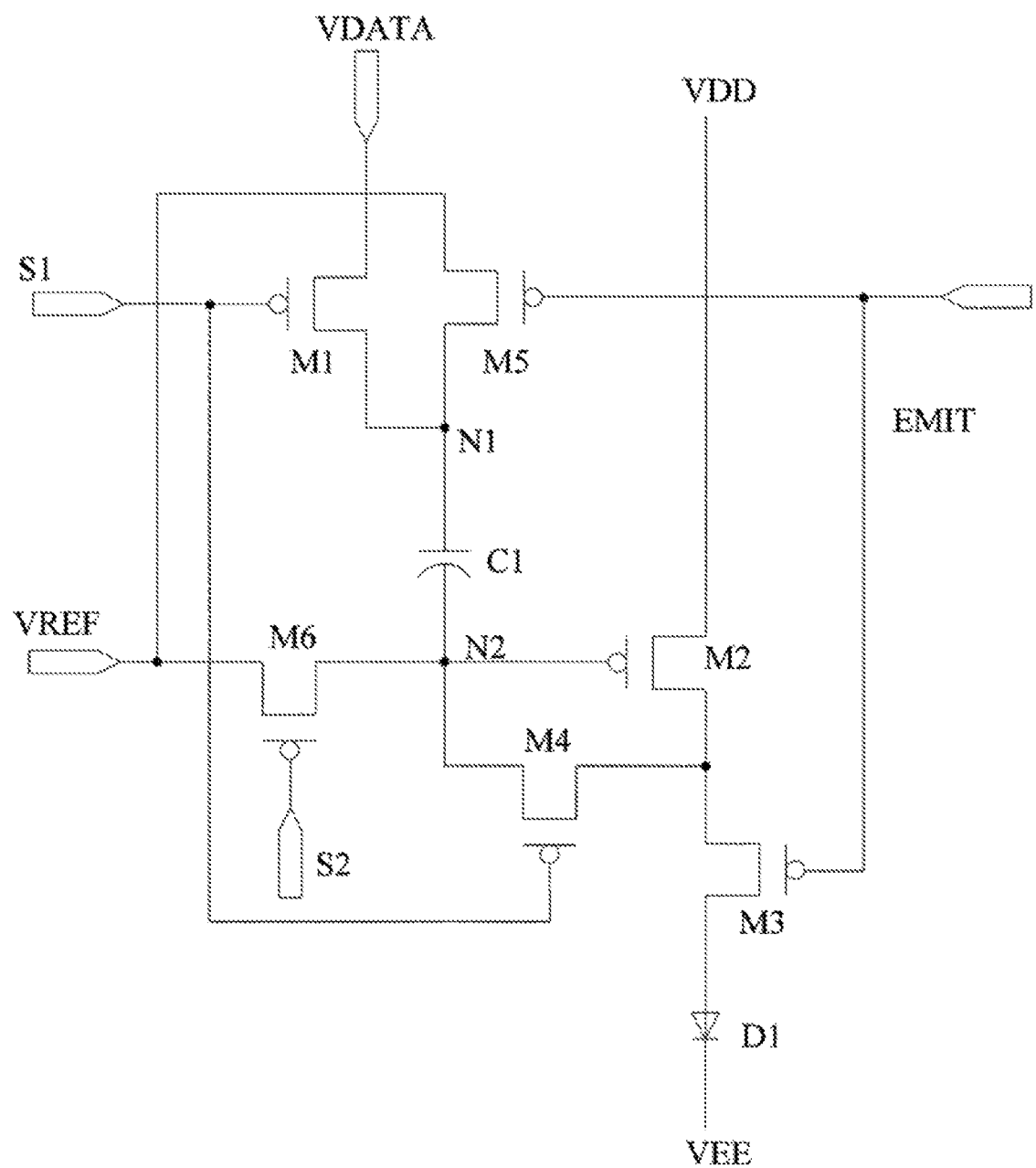
FIG. 3 is a schematic diagram of a pixel circuit according to an embodiment of the present invention.

The present invention provides a pixel circuit for an organic light emitting display, whereby the waveform of each driving signal can be defined to simplify the structure of the drive circuit and the power consumption of the circuit can be reduced. FIG. 3 shows a schematic circuit diagram of a pixel circuit for an organic light emitting display according to an embodiment of the present invention.

As shown in FIG. 3, the pixel circuit according to the embodiment of the present invention includes a first MOS transistor M1, a second MOS transistor M2, a third MOS transistor M3, a fourth MOS transistor M4, a fifth MOS transistor M5, a sixth MOS transistor M6, a first capacitor C1 and an organic light emitting diode D1.

The gate electrode of the first MOS transistor M1 receives a first scanning signal S1, the first electrode of the first MOS transistor M1 receives a data signal VDATA, and the second electrode of the first MOS transistor M1 is connected to the first terminal N1 of the first capacitor C1. The second terminal N2 of the first capacitor C1 is connected to the gate electrode of the second MOS transistor M2. The first electrode of the second MOS transistor M2 is connected to a first power supply VDD, and the second electrode of the second MOS transistor M2 is connected to the first electrode of the third MOS transistor M3. The gate electrode of the third MOS transistor M3 receives a control signal EMIT, and the second electrode of the third MOS transistor M3 is coupled to a second power supply VEE via the organic light emitting diode D1. The first electrode of the fourth MOS transistor M4 is connected to the second terminal N2 of the first capacitor C1, the second electrode of the fourth MOS transistor M4 is connected to the second electrode of the second MOS transistor M2, and the gate electrode of the fourth MOS transistor M4 receives the first scanning signal S1. The gate electrode of the fifth MOS transistor M5 receives the control signal EMIT, the first electrode of the fifth MOS transistor M5 receives a reference voltage VREF, and the second electrode of the fifth MOS transistor M5 is connected to the first terminal N1 of the first capacitor C1. The gate electrode of the sixth MOS transistor M6 receives a second scanning signal S2, the first electrode of the sixth MOS transistor M6 receives the reference voltage VREF, and the second electrode of the sixth MOS transistor M6 is connected to the gate electrode of the second MOS transistor M2.

Specifically, in this embodiment, the first MOS transistor, the second MOS transistor, the third MOS transistor, the fourth MOS transistor, the fifth MOS transistor and the sixth MOS transistor are all PMOS transistors. The first electrode refers to the source electrode of each of the PMOS transistors. The second electrode refers to the drain electrode of each of the PMOS transistors.

It should be noted that in other embodiments, the first MOS transistor, the second MOS transistor, the third MOS transistor, the fourth MOS transistor, the fifth MOS transistor and the sixth MOS transistor may also be NMOS transistors. Of course, the invention is not limited thereto, and other variations can be made in the first MOS transistor to the sixth MOS transistor by those skilled in the art. For example, one or more of the transistors may be PMOS transistors, and one or more other transistors may be NMOS transistors.

Figure 4:
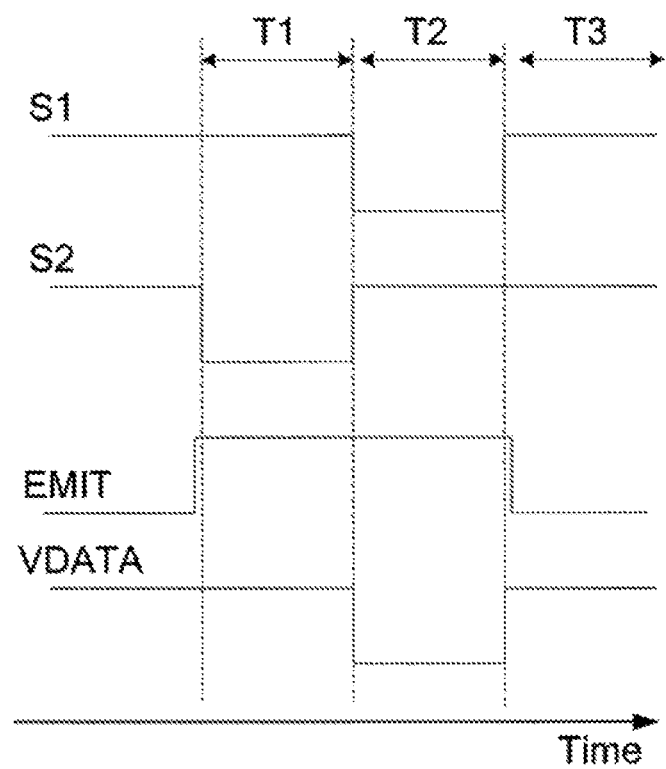
FIG. 4 is a timing diagram of driving signals for the pixel circuit shown in FIG. 3.

FIG. 4 shows a timing diagram of the scanning signals and the control signal for the pixel circuit according to the present invention. The operational principle of the pixel circuit according to the present invention will be described in further detail in conjunction with the FIG. 3 and the FIG. 4 below.

Referring to the FIG. 4, in Stage T1, both the first scanning signal S1 and the control signal EMIT are in high level. Accordingly, the first MOS transistor M1, the third MOS transistor M3, the fourth MOS transistor M4 and the fifth MOS transistor M5 are turned off. Furthermore, the second scanning signal S2 is in low level and the sixth MOS transistor M6 is turned on. The reference voltage VREF is transmitted to the gate electrode of the second MOS transistor M2 through the sixth MOS transistor M6, and the voltage at the second terminal N2 of the first capacitor C1 is VREF.

In Stage T2, the first scanning signal S1 is turned to low level, and thus the first MOS transistor M1 is turned on. In response, the voltage at the first terminal N1 of the first capacitor C1 becomes VDATA. Furthermore, the fourth MOS transistor M4 is turned on, so that a diode connection is formed in the second MOS transistor M2. In this case, the voltage at the second terminal N2 of the first capacitor C1 is VDD−Vth (Vth is the threshold voltage of the MOS transistor), and thus the voltage difference across the first capacitor C1 is VDATA−(VDD−Vth). Moreover, the second scanning signal S2 is turned to high level, and thus the sixth MOS transistor M6 is turned off. The control signal EMIT is still high level, and thus the third MOS transistor M3 and the fifth MOS transistor M5 are turned off.

In Stage T3, the first scanning signal S1 is turned to high level, and thus the first MOS transistor M1 and the fourth MOS transistor M4 are turned off. The second scanning signal S2 is in high level, and thus the sixth MOS transistor M6 is turned off. The control signal EMIT is turned to low level, and thus the third MOS transistor M3 and the fifth MOS transistor M5 are turned on. The voltage at the first terminal N1 of the first capacitor C1 is reset because the fifth MOS transistor M5 is turned on. Accordingly, the voltage at the first terminal N1 of the first capacitor C1 is VREF. According to the law of charge conservation, the voltage at the second terminal N2 of the first capacitor C1 is VREF−VDATA+(VDD−Vth). Accordingly, the voltage difference between the source electrode and the gate electrode of the second MOS transistor M2 is Vsg=VDD−VREF+VDATA−(VDD−Vth)=VDATA−VREF+Vth. It can be concluded that the current flowing through the second MOS transistor M2 is Im2=k(Vdata−Vref)^2, where k is a constant coefficient which is related to the mobility, the width to length ratio and the gate-source capacitance value of the MOS transistor. The organic light emitting diode D1 is driven to emit light when the third MOS transistor M3 is turned on.

It can be known from the above mentioned operational principle that the compensation for the threshold voltage Vth and the first supply voltage VDD has been achieved through the pixel circuit according to the embodiment of the present invention. It can be seen from the FIG. 4 that the first scanning signal S1 and the second scanning signal S2 are independent of each other in time sequence and are not both turned on at the same time. Accordingly, a more simple drive circuit can be used to provide the drive signals, and the operation of the drive circuit is more convenient. In addition, since the drive signals are independent of each other in the time sequence, the multi-channel selection of the pixel circuit can be achieved so as to improve the integrity and convenience of the pixel circuit.

In addition, according to the embodiment of the present invention, in an initialization stage (i.e. Stage T1), it is not necessary to continuously provide the data signal VDATA to the pixel circuit. This is because the fourth MOS transistor M4 is not turned on in the initialization stage, so there is no resistance drop by the second PMOS transistor MP2 and the third PMOS transistor MP3 as shown in FIG. 1, but the second terminal N2 of the first capacitor C1 is charged to the potential VREF directly. Meanwhile, neither the first MOS transistor M1 nor the fifth MOS transistor M5 is turned on. Therefore the leakage current does not occur at the first terminal N1 of the first capacitor C1. Accordingly, the data line connected to the first MOS transistor M1 can be left floating. The pixel circuit with this structure reduces the difficulty in IC development and power consumption of the circuit, since it is not necessary to continuously provide the data signal VDATA with a relatively high potential.

The present invention further provides a driving method for the pixel circuit shown in FIG. 3. The driving method includes the following stages. In an initialization stage, the first MOS transistor M1 and the fourth MOS transistor M4 are turned off via the first scanning signal S1, the third MOS transistor M3 and the fifth MOS transistor M5 are turned off via the control signal EMIT, the sixth MOS transistor M6 is turned on via the second scanning signal S2, and the reference voltage VREF is transmitted to the gate electrode of the second MOS transistor M2 through the sixth MOS transistor M6.

In a data-writing stage, the first MOS transistor M1 and the fourth MOS transistor M4 are turned on via the first scanning signal S1, and the data signal VDATA is transmitted to the first terminal of the first capacitor C1 through the first MOS transistor M1, and the fourth MOS transistor M4 is turned on, resulting in a diode connection formed in the second MOS transistor M2; the sixth MOS transistor M6 is turned off via the second scanning signal S2, and the third MOS transistor M3 and the fifth MOS transistor M5 are turned off via the control signal EMIT.

In a light emitting stage, the first MOS transistor M1 and the fourth MOS transistor M4 are turned off via the first scanning signal S1, the sixth MOS transistor M6 is turned off via the second scanning signal S2, the fifth MOS transistor M5 and the third MOS transistor M3 are turned on via the control signal EMIT. The voltage across the first capacitor C1 is reset due to the turning on of the fifth MOS transistor M5, a corresponding drive current is generated by the third MOS transistor M3 based on the reset of the voltage across the first capacitor C1, and the drive current is configured to drive the organic light emitting diode D1 to emit light.

The data signal may be provided in the data-writing stage, while the data signal may be not provided in the initialization stage and the light emitting stage. In other words, the data line can be left floating in the initialization stage and the light emitting stage.

Figure 5:
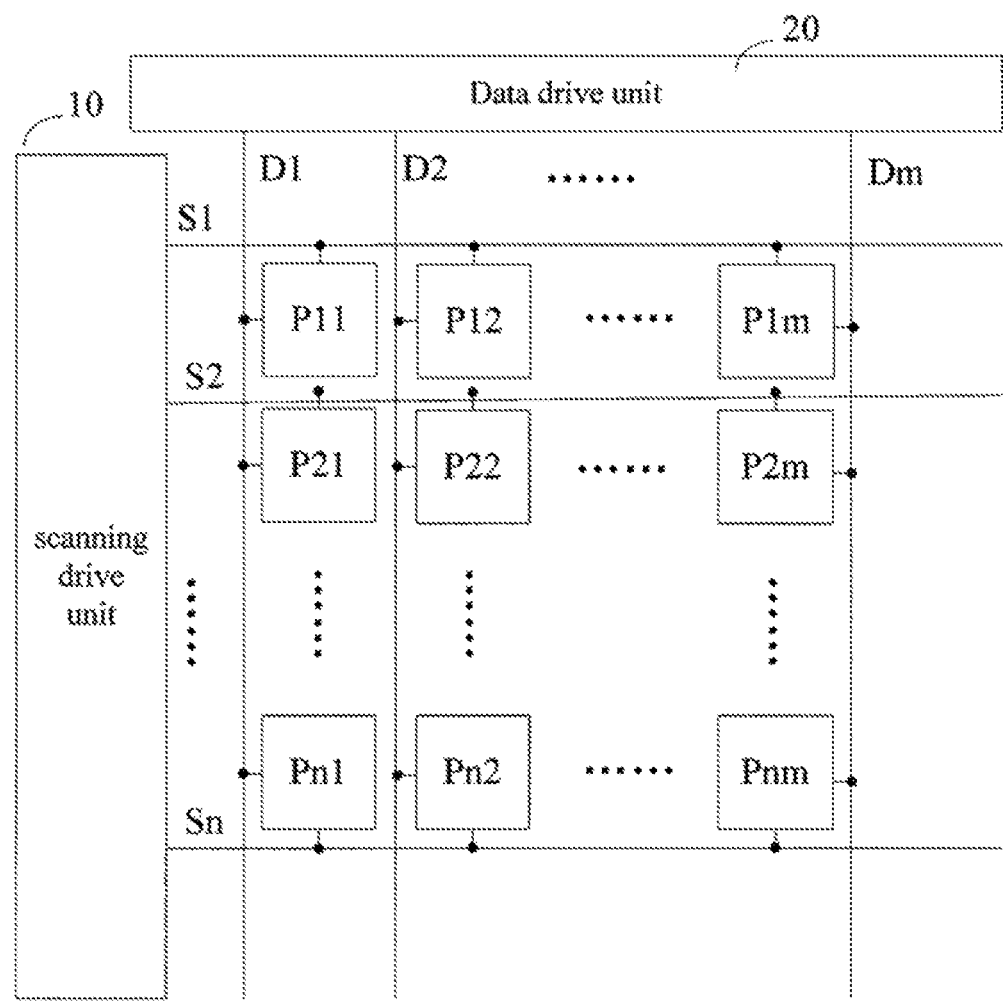
FIG. 5 is a schematic structural diagram of an organic light emitting display according to an embodiment of the present invention.

The present invention further provides an organic light emitting display. As shown in FIG. 5, the organic light emitting display includes: a scanning drive unit 10, a data drive unit 20, N scan lines (S1, S2, . . . , Sn), M data lines (D1, D2, . . . , Dm) and multiple pixel circuits (P11, P12, . . . , P1m, P21, P22, . . . , P2m, Pn1, Pn2, . . . , Pnm). The structures of the pixel circuits are similar to that of the pixel circuit shown in FIG. 3 or similar to that of the pixel circuit shown in FIG. 6 or FIG. 8 which will be described detailed below.

Specifically, the scanning drive unit 10 is configured to provide scanning signals to respective scan lines (S1, S2, . . . , Sn). The data drive unit 20 is configured to provide data signals to respective data lines (D1, D2, . . . , Dm). The multiple pixel circuits are respectively arranged in pixel areas formed by intersection of the N scan lines and the M data lines.

In each of the pixel circuits for the organic light emitting display according to the present invention, the gate electrodes of the first MOS transistor M1 and the fourth MOS transistor M4 may be both connected to the nth scan line, and the gate electrode of the sixth MOS transistor M6 is connected to the (n+1)th scan line, where $1 \leq n < N$.

In other embodiments, the gate electrode of the first MOS transistor M1, the gate electrode of the fourth MOS transistor M4 and the gate electrode of the sixth MOS transistor M6 may be connected to the scan lines in other ways, which are not limited to the embodiment described above.

Compared with the drive circuit in the prior art, the scanning drive circuit for the organic light emitting display according to the embodiment of the present invention is simpler in structure and more convenient in operation. In addition, it is not necessary to continuously provide the data signal to the data line in the initialization stage. Therefore, the power consumption of the organic light emitting display according to the embodiment of the present invention is also lower than that in the prior art.

Figure 6:
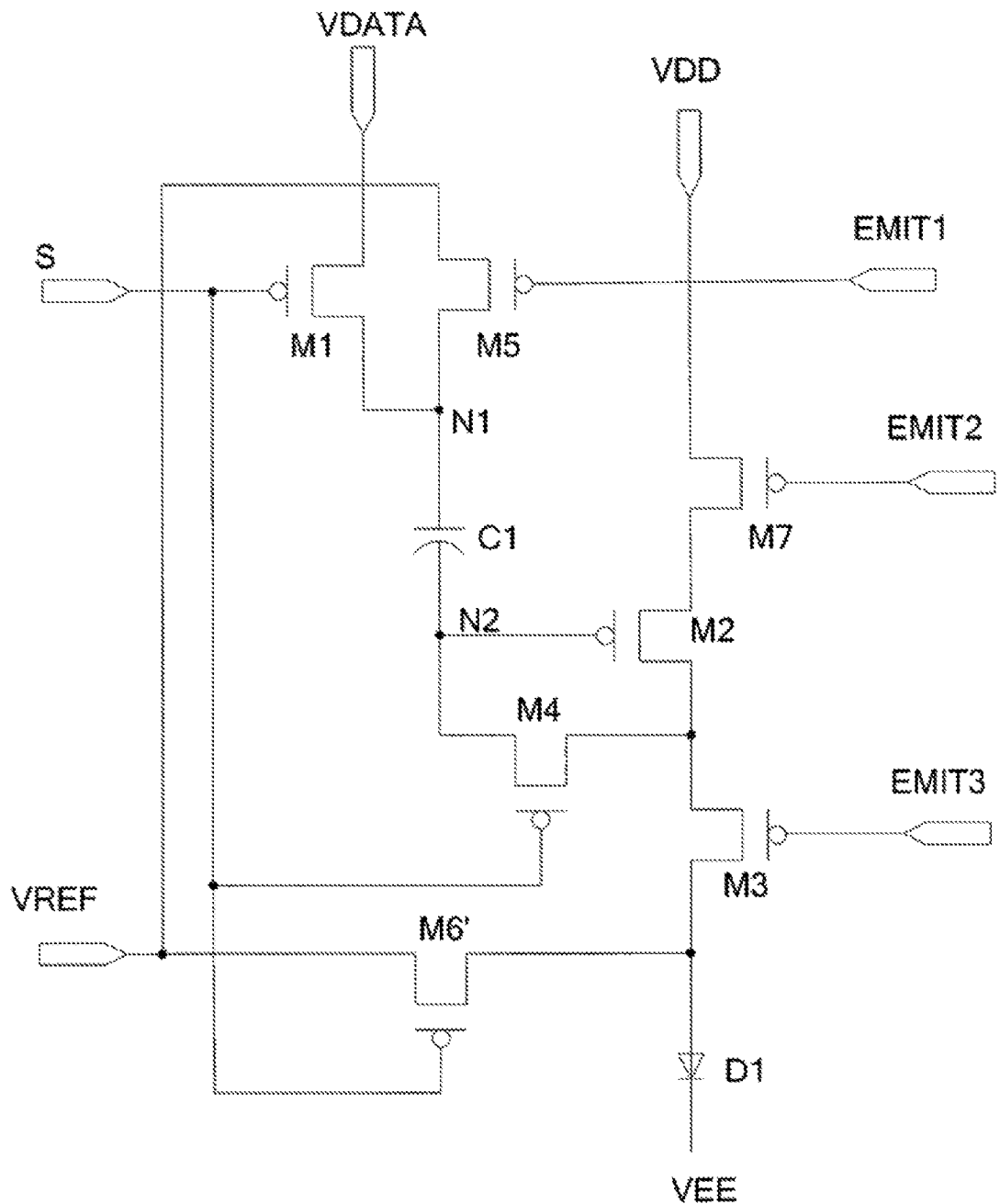
FIG. 6 is a schematic diagram of a pixel circuit according to another embodiment of the present invention.

FIG. 6 shows a schematic circuit diagram of a pixel circuit for an organic light emitting display according to an embodiment of the present invention.

As shown in FIG. 6, the pixel circuit according to the embodiment of the present invention includes a first Metal Oxide Semiconductor (MOS) transistor M1, a second MOS transistor M2, a third MOS transistor M3, a fourth MOS transistor M4, a fifth MOS transistor M5, a sixth MOS transistor M6', a seventh MOS transistor M7, a first capacitor C1 and an organic light emitting diode D1.

The gate electrode of the first MOS transistor M1 receives a scanning signal S, the first electrode of the first MOS transistor M1 receives a data signal VDATA, and the second electrode of the first MOS transistor M1 is connected to the first terminal N1 of the first capacitor C1. The second terminal N2 of the first capacitor C1 is connected to the gate electrode of the second MOS transistor M2. The first electrode of the second MOS transistor M2 is connected to the second electrode of the seventh MOS transistor M7, and the second electrode of the second MOS transistor M2 is connected to the first electrode of the third MOS transistor M3. The gate electrode of the third MOS transistor M3 receives a third control signal EMIT3, and the second electrode of the third MOS transistor M3 is coupled to a second power supply VEE via the organic light emitting diode D1. Specifically, the second electrode of the third MOS transistor M3 is connected to the anode of the organic light emitting diode D1. The first electrode of the fourth MOS transistor M4 is connected to the second terminal N2 of the first capacitor C1, the second electrode of the fourth MOS transistor M4 is connected to the second electrode of the second MOS transistor M2, and the gate electrode of the fourth MOS transistor M4 receives the scanning signal S. The gate electrode of the fifth MOS transistor M5 receives a first control signal EMIT1, the first electrode of the fifth MOS transistor M5 receives a reference voltage VREF, and the second electrode of the fifth MOS transistor M5 is connected to the first terminal N1 of the first capacitor C1. The gate electrode of the sixth MOS transistor M6' receives the scanning signal S, the first electrode of the sixth MOS transistor M6' receives the reference voltage VREF, and the second electrode of the sixth MOS transistor M6' is connected to the second electrode of the third MOS transistor M3. The gate electrode of the seventh MOS transistor M7 receives a second control signal EMIT2, the first electrode of the seventh MOS transistor M7 is connected to a first power supply VDD, the second electrode of the seventh MOS transistor M7 is connected to the first electrode of the second MOS transistor M2.

Specifically, in the embodiment illusrtrated by FIG. 6, the first MOS transistor, the second MOS transistor, the third MOS transistor, the fourth MOS transistor, the fifth MOS transistor, the sixth MOS transistor and the seventh MOS transistor are all PMOS transistors. The first electrode refers to the source electrode of each of the PMOS transistors. The second electrode refers to the drain electrode of each of the PMOS transistors.

It should be noted that in other embodiments, the first MOS transistor, the second MOS transistor, the third MOS transistor, the fourth MOS transistor, the fifth MOS transistor, the sixth MOS transistor and the seventh MOS transistor may also be NMOS transistors. Of course, the invention is not limited thereto, and other variations can be made in the first MOS transistor to the seventh MOS transistor by those skilled in the art. For example, one or more of the transistors may be PMOS transistors, and one or more other transistors may be NMOS transistors.

Figure 7:
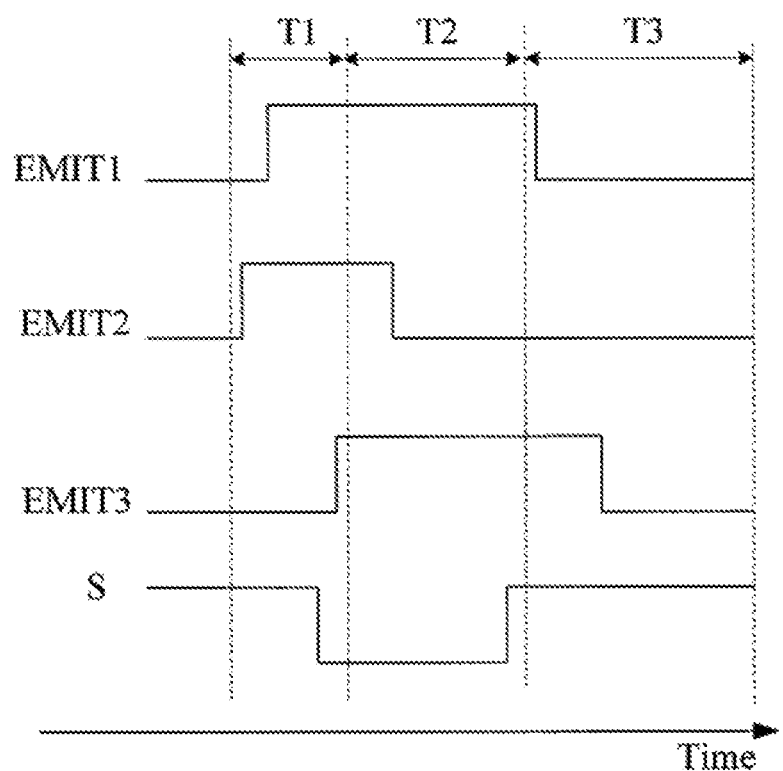
FIG. 7 is a timing diagram of driving signals for the pixel circuit shown in FIG. 6.

FIG. 7 shows a timing diagram of the scanning signal and the control signal for the pixel circuit as shown in FIG. 6. The operational principle of the pixel circuit according to the present invention will be described in further detail in conjunction with the FIG. 6 and the FIG. 7 below.

Referring to the FIG. 7, T1 represents an initialization stage. In stage T1, the voltage at the first terminal N1 of the first capacitor C1 is the reference voltage VREF, and the voltage at the second terminal N2 of the first capacitor C1 is also the reference voltage VREF. The second MOS transistor M2 is in an "off" state. No large current flows through the circuit.

T2 represents a threshold detection stage. In stage T2, the organic light emitting diode is reset. The voltage at the second terminal N2 of the first capacitor C1 is turned to VDD−|Vth| (Vth is the threshold voltage of the MOS transistor).

T3 represents a coupling and light-emitting stage. In stage T3, when the first control signal EMIT1 is at a low level and the third control signal EMIT3 is at a high level, the voltage at the first terminal N1 of the first capacitor C1 is turned from VDATA to VREF. That is to say, the voltage at the first terminal N1 of the first capacitor C1 is changed by Δ V=VREF−VDATA. Because of capacitance coupling, the voltage at the second terminal N2 of the first capacitor C1 is turned to VDD−|Vth|+VREF−VDATA. Accordingly, the voltage difference between the source electrode and the gate electrode of the second MOS transistor M2 is Vsg=VDD−(VDD−|Vth|+VREF−VDATA)=|Vth|−VREF+VDATA.

Then the third control signal EMIT3 is turned to a low level and the current in the circuit is ID=k(Vsg−|Vth|)^2=k(VDATA−VREF)^2, where k is a constant coefficient which is related to the mobility, the width to length ratio and the gate-source capacitance value of the MOS transistor.

It can be known from the above mentioned operational principle that the compensation for the threshold voltage Vth and the first supply voltage VDD has been achieved through the pixel circuit according to an embodiment of the present invention.

Usually, charges may be stored in an organic light emitting diode which has operated for a long period of time. Such charges are generally referred to as residual charges. Even when being in a dark state, the organic light emitting diode may still emit light due to the existence of the residual charges. This problem can be solved according to the embodiments of the invention, since the residual charges in the organic light emitting diode can be released by the sixth MOS transistor M6'.

In addition, for the circuit as shown in FIG. 6, when the second terminal N2 of the first capacitor C1 or the anode of the organic light emitting diode is reset, if the second MOS transistor M2, the third MOS transistor M3, the fourth MOS transistor M4, the seventh MOS transistor M7 are all turned on, a large current will occur in the circuit which may increase the energy consumption of the circuit. According to an embodiment of the invention, when the second terminal N2 of the first capacitor C1 is reset, the third MOS transistor M3 and the fourth MOS transistor M4 are turned on, and others, such as the seventh MOS transistor M7, are turned off. Thus, a large current can be avoided. Meanwhile, when the anode of the organic light emitting diode is reset, the third MOS transistor M3 is turned off, which can also avoid large current. Thereby, the energy consumption of the circuit can be reduced.

Figure 8:
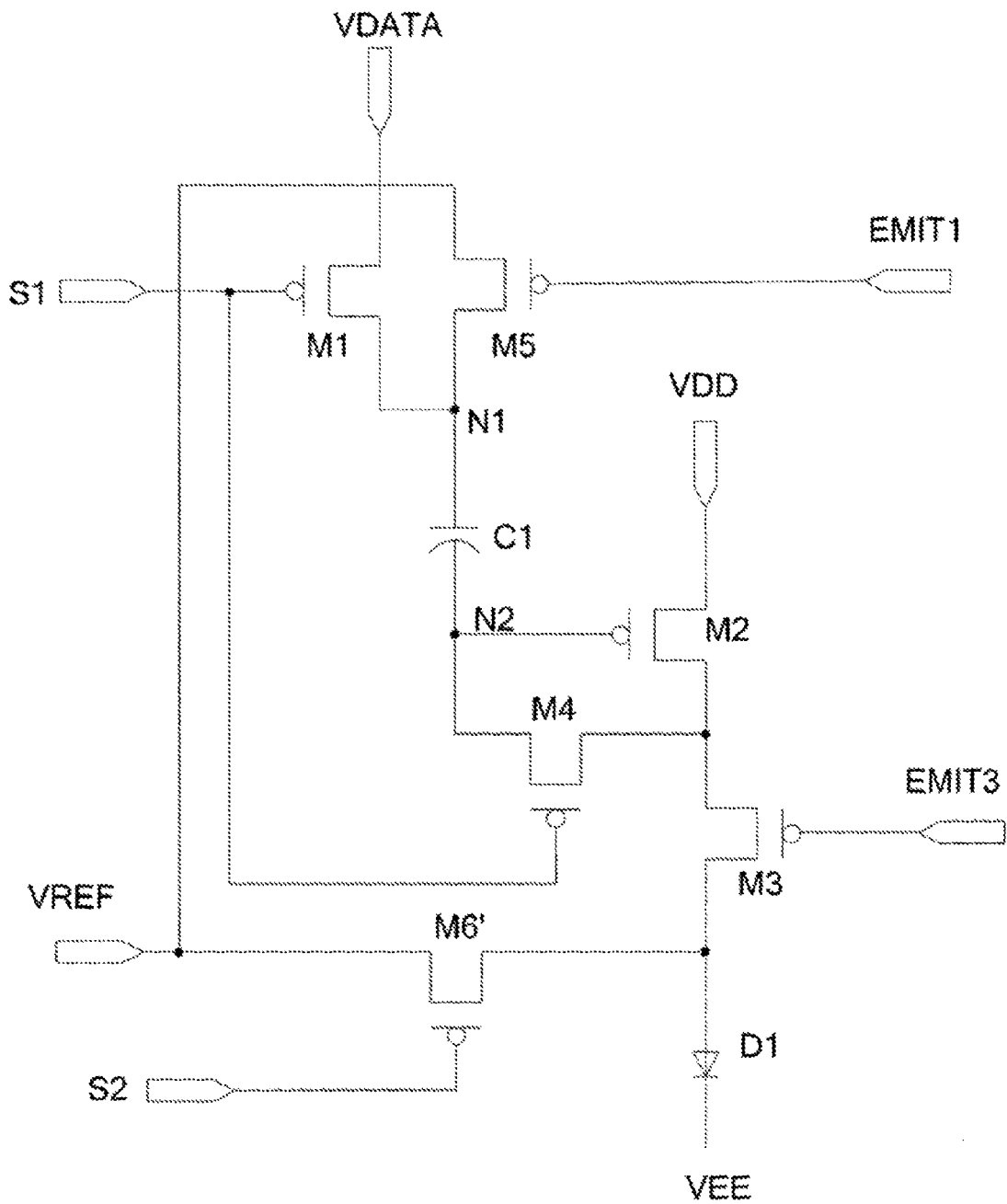
FIG. 8 is a schematic diagram of a pixel circuit according to still another embodiment of the present invention.

FIG. 8 shows a schematic circuit diagram of a pixel circuit for an organic light emitting display according to an embodiment of the present invention.

As shown in FIG. 8, the pixel circuit according to the embodiment of the present invention includes a first MOS transistor M1, a second MOS transistor M2, a third MOS transistor M3, a fourth MOS transistor M4, a fifth MOS transistor M5, a sixth MOS transistor M6', a first capacitor C1 and an organic light emitting diode D1.

The gate electrode of the first MOS transistor M1 receives a first scanning signal S1, the first electrode of the first MOS transistor M1 receives a data signal VDATA, and the second electrode of the first MOS transistor M1 is connected to the first terminal N1 of the first capacitor C1. The second terminal N2 of the first capacitor C1 is connected to the gate electrode of the second MOS transistor M2. The first electrode of the second MOS transistor M2 is connected to a first power supply VDD, and the second electrode of the second MOS transistor M2 is connected to the first electrode of the third MOS transistor M3. The gate electrode of the third MOS transistor M3 receives a third control signal EMIT3, and the second electrode of the third MOS transistor M3 is coupled to a second power supply VEE via the organic light emitting diode D1. Specifically the second electrode of the third MOS transistor M3 is connected to the anode of the organic light emitting diode D1. The first electrode of the fourth MOS transistor M4 is connected to the second terminal N2 of the first capacitor C1, the second electrode of the fourth MOS transistor M4 is connected to the second electrode of the second MOS transistor M2, and the gate electrode of the fourth MOS transistor M4 receives the first scanning signal S1. The gate electrode of the fifth MOS transistor M5 receives a first control signal EMIT1, the first electrode of the fifth MOS transistor M5 receives a reference voltage VREF, and the second electrode of the fifth MOS transistor M5 is connected to the first terminal N1 of the first capacitor C1. The gate electrode of the sixth MOS transistor M6' receives a second scanning signal S2, the first electrode of the sixth MOS transistor M6' receives the reference voltage VREF, and the second electrode of the sixth MOS transistor M6' is connected to the second electrode of the third MOS transistor M3.

Specifically, in this embodiment, the first MOS transistor, the second MOS transistor, the third MOS transistor, the fourth MOS transistor, the fifth MOS transistor, and the sixth MOS transistor are all PMOS transistors. The first electrode refers to the source electrode of each of the PMOS transistors. The second electrode refers to the drain electrode of each of the PMOS transistors.

It should be noted that in other embodiments, the first MOS transistor, the second MOS transistor, the third MOS transistor, the fourth MOS transistor, the fifth MOS transistor, and the sixth MOS transistor may also be NMOS transistors. Of course, the invention is not limited thereto, and other variations can be made in the first MOS transistor to the sixth MOS transistor by those skilled in the art. For example, in one embodiment, one or more of the transistors may be PMOS transistors, and one or more other transistors may be NMOS transistors.

Figure 9:
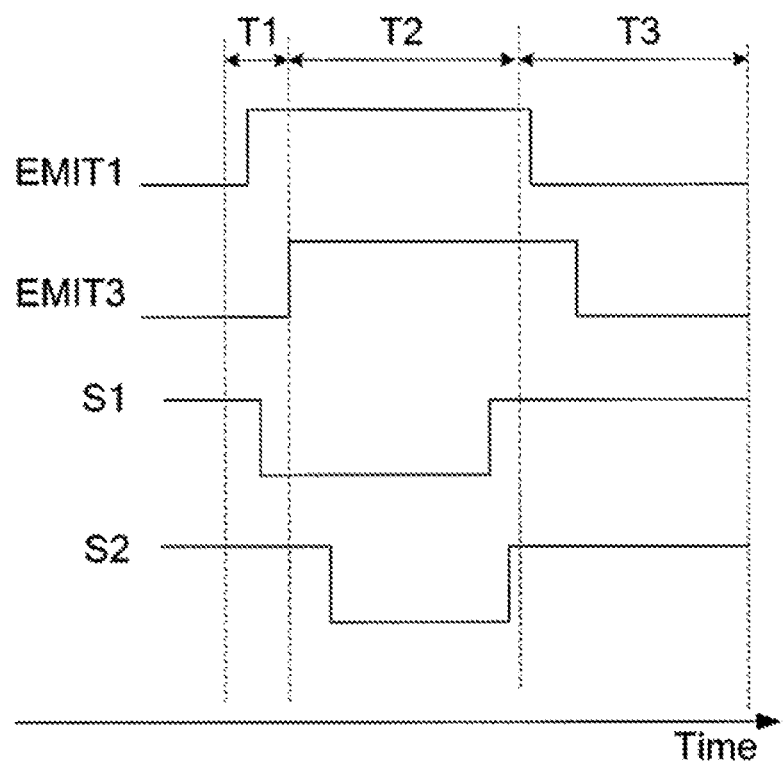
FIG. 9 is a timing diagram of driving signals for the pixel circuit shown in FIG. 8.

FIG. 9 shows a timing diagram of the scanning signals and the control signal for the pixel circuit as shown in FIG. 8. The operational principle of the pixel circuit according to the present invention will be described in further detail in conjunction with the FIG. 8 and the FIG. 9 below.

Referring to the FIG. 9, T1 represents an initialization stage. In stage T1, the voltage at the first terminal N1 of the first capacitor C1 is the reference voltage VREF, and the voltage at the second terminal N2 of the first capacitor C1 is the same as that at the anode of the organic light emitting diode D1.

T2 represents a threshold detection stage. In stage T2, the first MOS transistor M1, the second MOS transistor M2, the fourth MOS transistor M4, and the sixth MOS transistor M6' are turned on. The voltage at the first terminal N1 of the first capacitor C1 is VDATA. The voltage at the second terminal N2 of the first capacitor C1 is turned to VDD−Vth (Vth is the threshold voltage of the MOS transistor). The charges in the anode of the organic light emitting diode are released and thus the organic light emitting diode is initialized.

T3 represents a coupling and light-emitting stage. In stage T3, the first control signal EMIT1 is at a low level and the fifth MOS transistor M5 is turned on. The voltage at the first terminal N1 of the first capacitor C1 is turned from VDATA to VREF. That is to say, the voltage at the first terminal N1 of the first capacitor C1 is changed by Δ A V=VREF−VDATA, where VREF<VDATA. Because of capacitance coupling, the voltage at the second terminal N2 of the first capacitor C1 is turned to VDD−|Vth|+VREF−VDATA. Accordingly, the voltage difference between the source electrode and the gate electrode of the second MOS transistor M2 is Vsg=VDD−(VDD−|Vth|+VREF−VDATA)=|Vth|−VREF+VDATA. Then the third control signal EMIT3 is turned to a low level. When the organic light emitting diode emits light, the current in the circuit is ID=k(Vsg−|Vth|)^2=k (VDATA−VREF)^2, where k is a constant coefficient which is related to the mobility, the width to length ratio and the gate-source capacitance value of the MOS transistor.

It can be known from the above mentioned operational principle that the compensation for the threshold voltage Vth and the first supply voltage VDD has been achieved through the pixel circuit according to the embodiment of the present invention.

Usually, residual charges may be stored in an organic light emitting diode which has operated for a long period of time. Even when being in a dark state, the organic light emitting diode may still emit light due to the existence of residual charges. This problem can be solved according to the embodiments of the invention, since the residual charges in the organic light emitting diode can be released through the sixth MOS transistor M6'.

In addition, similar to the circuit as shown in FIG. 6, issues of residual charges and energy consumption for the circuit as shown in FIG. 8 can also be addressed.

Though the present invention is disclosed by way of specific embodiments as described above, those embodiments are not intended to limit the present invention. Based on the methods and the technical aspects disclosed above, possible variations and changes may be made to the technical solutions of the present invention by those skilled in the art without departing from the spirit and the scope of the present invention. Therefore, any change, equivalent alternation, or modification made to the above embodiments according to the principle of the present invention, which do not depart from the subject matters of the present invention, fall within the scope of protection of the present invention.

What is claimed is:

1. A pixel circuit for an organic light emitting display, the pixel circuit comprising:
    an organic light emitting diode;
    a first MOS transistor, comprising a gate electrode, a first electrode, and a second electrode;
    a second MOS transistor, comprising a gate electrode, a first electrode, and a second electrode, wherein the first electrode of the second MOS transistor is coupled to a first power supply;
    a third MOS transistor, comprising a gate electrode, a first electrode, and a second electrode, wherein the first electrode of the third MOS transistor is coupled to the second electrode of the second MOS transistor, and the second electrode of the third MOS transistor is coupled to a second power supply via the organic light emitting diode;
    a fourth MOS transistor, comprising a gate electrode, a first electrode, and a second electrode, wherein the first electrode of the fourth MOS transistor is coupled to the gate electrode of the second MOS transistor, and the second electrode of the fourth MOS transistor is coupled to the second electrode of the second MOS transistor;
    a fifth MOS transistor, comprising a gate electrode, a first electrode, and a second electrode;
    a sixth MOS transistor, comprising a gate electrode, a first electrode, and a second electrode, wherein the second electrode of the sixth MOS transistor is coupled to the second electrode of the third MOS transistor; and
    a first capacitor, comprising first and second terminals, wherein the first terminal of the first capacitor is coupled to the second electrode of the first MOS transistor and to the second electrode of the fifth MOS transistor, and the second terminal is coupled to the gate electrode of the second MOS transistor and to the first electrode of the fourth MOS transistor,
    wherein the gate electrode of the first MOS transistor receives a first scanning signal, the first electrode of the first MOS transistor receives a data signal, the gate electrode of the third MOS transistor receives a third control signal, the gate electrode of the fourth MOS transistor receives the first scanning signal, the gate electrode of the fifth MOS transistor receives a first control signal, the first electrode of the fifth MOS transistor receives a reference voltage, the gate electrode of the sixth MOS transistor receives a second scanning signal, and the first electrode of the sixth MOS transistor receives the reference voltage, and
    wherein the third control signal and the first control signal do not have the same start and end timings.

2. The pixel circuit according to claim 1, wherein the first scanning signal and the second scanning signal do not overlap.

3. The pixel circuit according to claim 1, wherein the first MOS transistor, the second MOS transistor, the third MOS transistor, the fourth MOS transistor, the fifth MOS transistor and the sixth MOS transistor are PMOS transistors.

4. The pixel circuit according to claim 1, wherein each of the first electrodes is a source electrode, and each of the second electrodes is a drain electrode.

5. The pixel circuit according to claim 1, further comprising a seventh MOS transistor coupled between the second MOS transistor and the first power supply,
    wherein the seventh MOS transistor comprises a gate electrode, a first electrode, and a second electrode, the first electrode of the seventh MOS transistor being coupled to the first power supply, the second electrode of the seventh MOS transistor being coupled to the first electrode of the second MOS transistor, the gate electrode of the seventh MOS transistor receiving a second control signal.

6. The pixel circuit according to claim 5, wherein the first scanning signal and the second scanning signal are the same.

7. The pixel circuit according to claim 5, wherein the first MOS transistor, the second MOS transistor, the third MOS transistor, the fourth MOS transistor, the fifth MOS transistor, the sixth MOS transistor and the seventh MOS transistor are PMOS transistors.

8. The pixel circuit according to claim 5, wherein each of the first electrodes is a source electrode, and each of the second electrodes is a drain electrode.

9. A driving method for a pixel circuit,
    the pixel circuit comprising:
        an organic light emitting diode;
        a first MOS transistor, comprising a gate electrode, a first electrode, and a second electrode;
        a second MOS transistor, comprising a gate electrode, a first electrode, a second electrode, wherein the first electrode of the second MOS transistor is coupled to a first power supply;
        a third MOS transistor, comprising a gate electrode, a first electrode, and a second electrode, wherein the first electrode of the third MOS transistor is coupled to the second electrode of the second MOS transistor, and the second electrode of the third MOS transistor is coupled to a second power supply via the organic light emitting diode;
a fourth MOS transistor, comprising a gate electrode, a first electrode, and a second electrode, wherein the first electrode of the fourth MOS transistor is coupled to the gate electrode of the second MOS transistor, and the second electrode of the fourth MOS transistor is coupled to the second electrode of the second MOS transistor;
a fifth MOS transistor, comprising a gate electrode, a first electrode, and a second electrode;
a sixth MOS transistor, comprising a gate electrode, a first electrode, and a second electrode, wherein the second electrode of the sixth MOS transistor is coupled to the second electrode of the third MOS transistor;
a first capacitor, comprising first and second terminals, wherein the first terminal of the first capacitor is coupled to the second electrode of the first MOS transistor and the second electrode of the fifth MOS transistor,
wherein the second terminal of the first capacitor is coupled to the gate electrode of the second MOS transistor and the first electrode of the fourth MOS transistor, wherein the gate electrode of the first MOS transistor receives a first scanning signal, the first electrode of the first MOS transistor receives a data signal, the gate electrode of the third MOS transistor receives a third control signal, the gate electrode of the fourth MOS transistor receives the first scanning signal, the gate electrode of the fifth MOS transistor receives a first control signal, the first electrode of the fifth MOS transistor receives a reference voltage, the gate electrode of the sixth MOS transistor receives a second scanning signal, and the first electrode of the sixth MOS transistor receives the reference voltage, wherein the method comprises:
during a light-emitting stage, setting the first control signal to a low level, and setting the third control signal at a high level until a voltage difference between the first electrode and the gate electrode of the second MOS transistor reaches a value which is a sum of a threshold voltage of the second MOS transistor and a difference bewteen a voltage of the data signal and the reference voltage.

10. The driving method according to claim 9, further comprising during a threshold detection stage, turning on the first MOS transistor, the second MOS transistor, the fourth MOS transistor, and the sixth MOS transistor.

11. The driving method according to claim 9, wherein:
the first scanning signal and the second scanning signal are the same;
the pixel circuit further comprises a seventh MOS transistor coupled between the second MOS transistor and the first power supply; and
the seventh MOS transistor comprises a gate electrode, a first electrode, and a second electrode, the first electrode of the seventh MOS transistor being coupled to the first power supply, the second electrode of the seventh MOS transistor being coupled to the first electrode of the second MOS transistor, the gate electrode of the seventh MOS transistor receiving a second control signal.

12. The driving method according to claim 11, wherein:
during the second terminal of the first capacitor is reset, the third MOS transistor and the fourth MOS transistor are turned on and the seventh MOS transistor is turned off; and
during an anode of the organic light emitting diode is reset, the third MOS transistor is turned off.

13. An organic light emitting display comprising:
a scanning drive unit;
a data drive unit;
N scan lines;
M data lines; and
a plurality of pixel circuits, each of the pixel circuits comprising:
an organic light emitting diode;
a first MOS transistor, comprising a gate electrode, a first electrode, and a second electrode;
a second MOS transistor, comprising a gate electrode, a first electrode, and a second electrode, wherein the first electrode of the second MOS transistor is coupled to a first power supply;
a third MOS transistor, comprising a gate electrode, a first electrode, and a second electrode, wherein the first electrode of the third MOS transistor is coupled to the second electrode of the second MOS transistor, and the second electrode of the third MOS transistor is coupled to a second power supply via the organic light emitting diode;
a fourth MOS transistor, comprising a gate electrode, a first electrode, and a second electrode, wherein the first electrode of the fourth MOS transistor is coupled to the gate electrode of the second MOS transistor, and the second electrode of the fourth MOS transistor is coupled to the second electrode of the second MOS transistor;
a fifth MOS transistor, comprising a gate electrode, a first electrode, and a second electrode;
a sixth MOS transistor, comprising a gate electrode, a first electrode, and a second electrode, wherein the second electrode of the sixth MOS transistor is coupled to the second electrode of the third MOS transistor; and
a first capacitor, comprising first and second terminals, wherein the first terminal of the first capacitor is coupled to the second electrode of the first MOS transistor and is coupled to the second electrode of the fifth MOS transistor, and the second terminal is coupled to the gate electrode of the second MOS transistor and is coupled to the first electrode of the fourth MOS transistor,
wherein the gate electrode of the first MOS transistor receives a first scanning signal, the first electrode of the first MOS transistor receives a data signal, the gate electrode of the third MOS transistor receives a third control signal, the gate electrode of the fourth MOS transistor receives the first scanning signal, the gate electrode of the fifth MOS transistor receives a first control signal, the first electrode of the fifth MOS transistor receives a reference voltage, the gate electrode of the sixth MOS transistor receives a second scanning signal, and the first electrode of the sixth MOS transistor receives the reference voltage,
wherein the scanning drive unit is configured to provide scanning signals to respective scan lines, the data drive unit is configured to provide data signals to respective data lines, and the plurality of the pixel circuits are respectively arranged in pixel areas formed near intersections of the scan lines and the data lines, and wherein the third control signal and the first control signal do not have the same start and end timings.

14. The organic light emitting display according to claim 13, wherein the gate electrodes of the first MOS transistor and the fourth MOS transistor are both coupled to an nth scan line, and the gate electrode of the sixth MOS transistor is coupled to an (n+1)th scan line, where 1≤n<N.

15. The organic light emitting display according to claim 13, wherein the first scanning signal and the second scanning signal do not overlap.

16. The organic light emitting display according to claim 13, wherein the first MOS transistor, the second MOS transistor, the third MOS transistor, the fourth MOS transistor, the fifth MOS transistor and the sixth MOS transistor are PMOS transistors.

17. The organic light emitting display according to claim 13, wherein each of the pixel circuits further comprising a seventh MOS transistor coupled between the second MOS transistor and the first power supply, and wherein the seventh MOS transistor comprises a gate electrode, a first electrode, and a second electrode, the first electrode of the seventh MOS transistor being coupled to the first power supply, the second electrode of the seventh MOS transistor being coupled to the first electrode of the second MOS transistor, the gate electrode of the seventh MOS transistor receiving a second control signal.

18. The organic light emitting display according to claim 17, wherein the gate electrodes of the first MOS transistor, the fourth MOS transistor, and the sixth MOS transistor are coupled to an nth scan line.

19. The organic light emitting display according to claim 17, wherein the first MOS transistor, the second MOS transistor, the third MOS transistor, the fourth MOS transistor, the fifth MOS transistor, the sixth MOS transistor and the seventh MOS transistor are PMOS transistors.

20. The organic light emitting display according to claim 17, wherein each of the first electrodes is a source electrode, and each of the second electrodes is a drain electrode.

* * * * *